United States Patent
Wang et al.

(10) Patent No.: US 6,407,433 B1
(45) Date of Patent: Jun. 18, 2002

(54) PREVENTING GATE OXIDE DAMAGE BY POST POLY DEFINITION IMPLANTATION WHILE GATE MASK IS ON

(75) Inventors: Jyh-Haur Wang; Chih-Heng Shen, both of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/575,446

(22) Filed: May 22, 2000

Related U.S. Application Data

(62) Division of application No. 08/844,629, filed on Apr. 21, 1997, now Pat. No. 6,187,639.

(51) Int. Cl.[7] .................................................. H01L 29/76

(52) U.S. Cl. .......................... 257/356; 257/357; 257/368

(58) Field of Search ................................ 257/368, 356, 257/357

(56) References Cited

U.S. PATENT DOCUMENTS

| | | | |
|---|---|---|---|
| 4,818,714 A | * | 4/1989 | Haskell ........................ 437/30 |
| 5,348,897 A | | 9/1994 | Yen .............................. 437/40 |
| 6,078,071 A | * | 6/2000 | Matsuda ...................... 257/485 |

OTHER PUBLICATIONS

S. Wolf. "Silicon Processing for the VLSI Era" vol. 3, Lattice Press, Sunset Beach, CA, 1995, pp. 504,505,513.

* cited by examiner

*Primary Examiner*—Fetsum Abraham
(74) *Attorney, Agent, or Firm*—George O Saile; Stephen B. Ackerman; Sevgin Oktay

(57) ABSTRACT

A method for preventing gate oxide damage caused by post poly definition implantation is disclosed. It is shown that the antenna ratio that is correlatable to oxide damage can be reduced and made to approach zero by implementing a mask layout during ion implantation. This involves covering all of the polysilicon electrodes with a photoresist mask, and reducing the effective antenna ratio to zero, and performing ion implantation to form source/drain regions thereafter. In this manner, the dependency of ion implantation to pattern sensitivity is also removed.

13 Claims, 7 Drawing Sheets

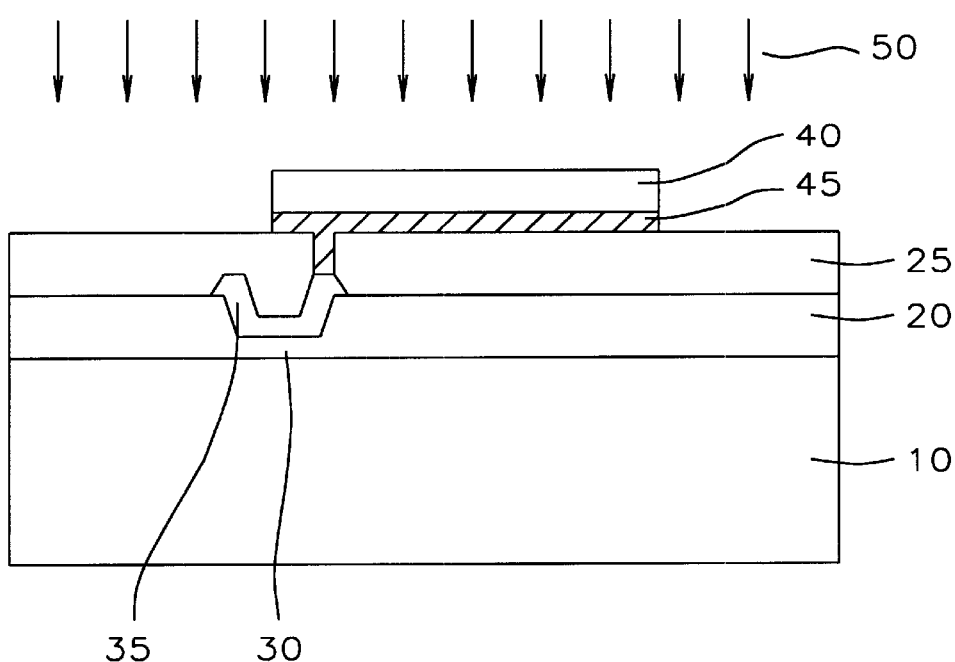
FIG. 1 - Prior Art
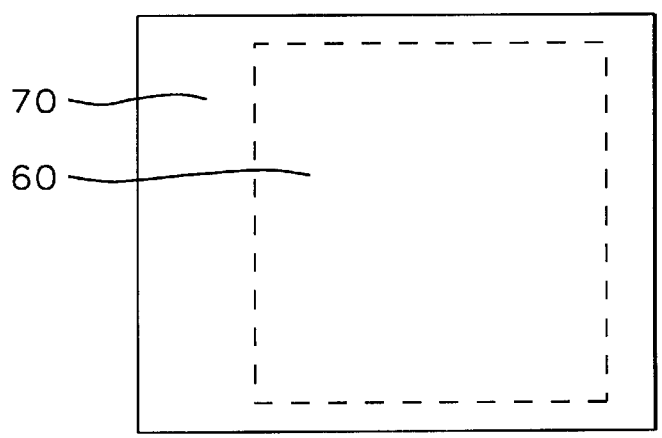
FIG. 2a
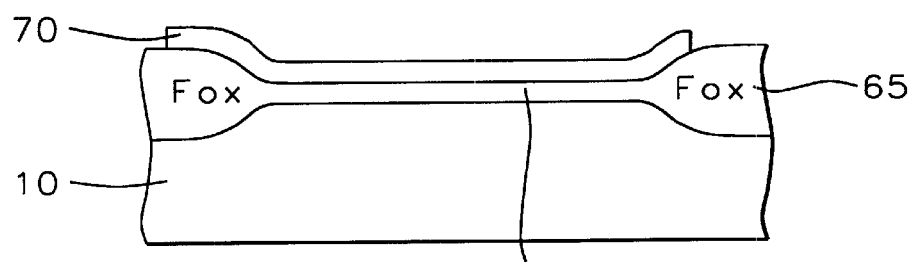
FIG. 2b

PREVENTING GATE OXIDE DAMAGE BY POST POLY DEFINITION IMPLANTATION WHILE GATE MASK IS ON

This is a division of patent application Ser. No. 08/844,629, U.S. Pat. No. 6,187,639 filing date Apr. 21, 1997, A Novel Method To Prevent Gate Oxide Damage By Post Poly Definition Implantation, assigned to the same assignee as the present invention.

BACKGROUND OF THE INVENTION (1) Field of the Invention

The present invention relates generally to semiconductor manufacturing, and more particularly to a method for preventing gate oxide damage during post poly definition implantation.

(2) Description of the Related Art

Reliability of gate oxides in integrated circuits (IC) is of the utmost importance in providing high performance IC chips. The main performance criteria in digital CMOS ICs are, among others, speed and packing density. As is well known in the field, scaling down, that is, reducing device size has been the chief vehicle for achieving increased packing density. Scaling down device size in turn, means using smaller channel lengths and widths. To increase the speed, the saturation drain current ($I_{dsat}$) must be increased. It is known that a decrease in either the channel length or the gate oxide thickness ($t_{ox}$) will lead to an increase in $I_{dsat}$. Furthermore, $I_{dsat}$ will increase more rapidly if gate oxide is made thinner at the same time. Thus, this provides even a greater incentive for growing gate oxide as thin as possible as gate channel lengths are decreased further in the drive for higher density ICs.

Gate oxide thickness has grown smaller with each generation of MOS ICs. It is believed that the current trend will lead to gate oxide thicknesses below 5 nanometers (nm) as the MOSFET technology is scaled below 0.5 micrometers ($\mu$m). It is also believed that unless the power supply voltage is also reduce—even lower than the 3.3V in some 0.5 $\mu$m CMOS technologies of today—there will be severe reliability problems in oxide films thinner than 10 nm. While the benefits of using thin oxides are well known in the field, such oxides must exhibit adequate reliability characteristics under normal circuit operating conditions. An additional contributor to the reliability concerns is the damage caused to thin gate oxides when a metal conductor such as the polysilicon gate over gate oxide is locally charged. Such local charging can occur when a semiconductor wafer is subjected to any number of semiconductor processes involving, for example, plasma etching or ion implantation.

Thin oxide films undergo catastrophic failures when stressed by high electric fields. High electric fields can result when surface charging occurs on a semiconductor wafer. How isolated conductor regions on a wafer surface can be charged up by plasma is described elsewhere (See S. Wolf and R. N. Tauber, "Silicon Processing for the VLSI Era," vol. 3, Lattice Press, Sunset Beach, Calif., 1990, pp. 504–505.) and as they are not significant to the invention, they are not described in detail here in order not to unnecessarily obscure the present invention. It is sufficient to note that if the plasma is non-uniform, the ensuing ion and electron currents on the surface of the wafer are also non-uniform. If a region of the surface is an insulator, the non-uniform current flows can set up a charge locally. Following Wolf above, if, specifically, an island of conductor material is sitting on an oxide, and this island is elsewhere not connected to a substrate (10) as shown in FIG. 1 (e.g., a poly line (35) that serves as a gate), the locally non-uniform ion and electron currents can charge the conductor. The surface area of such a conductor exposed to impingement by the charged plasma is known as the antenna surface. It is to be noted in FIG. 1 that aluminum lines (45) are being formed by plasma etch (50). Metal layer (45) is separated from the poly interconnect layer (35) below by a chemical vapor deposited (CVD) oxide layer, or interlevel dielectric. The metal lines are then patterned by photoresist mask (40). Hence, aluminum line (45) becomes the antenna. Since the antenna can span both the thick oxide (field regions, 20) and thin oxide (gate regions, 30) as shown in FIG. 1, the antenna/thin oxide area-ratio can exceed unity. The charging will therefore result in an increased voltage across the thin oxide. This charge build up will continue until the non-uniform currents will balance out, or the oxide begins to conduct. If the oxide begins to conduct, for example, by the well-known Fowler-Nordheim tunneling phenomenon, charge passage through the oxide may cause damage that can eventually lead to oxide breakdown failure.

Antenna structures are especially suited for testing of gate oxide for damage caused by Fowler-Nordheim tunneling due to charge build up on the poly gate during exposure to plasma ions. Using such structures as test structures, it can be shown that the extent of damage is dependent upon the amount of surface area or the edge area of the poly gate that is exposed to the plasma. Thus, a masking method is proposed in this invention whereby the exposed surface area as well as the edge area of the conductor attached to the poly gate on the field oxide can be made very small so as to prevent gate oxide damage. In other words, the effective antenna ratio, namely, the ratio of the plasma exposed area of the antenna region over field oxide to the area of the gate over the gate oxide, can be made to approach zero by judicious masking. It will be shown in the preferred embodiments of this invention that with small effective antenna ratios, oxide damage can be prevented during exposure of wafer to ions and electron currents.

In prior art, masking methods have been devised in fabricating IC devices, but mainly for the purposes of defining dimensions associated with the gate, gate oxide, and the channel length between the source and drain of the device. In U.S. Pat. No. 5,348,897, for example, Yen proposes using overlapping masks so that one could achieve a smaller device area and hence higher packing density. However, it is not clear how this approach can alleviate oxide damage during ion implantation, especially when heavy doping is performed. What is needed therefore is a masking method designed to reduce the effective antenna ratio to zero, and hence prevent oxide damage during exposure to plasma ions as well as ion implantation.

SUMMARY OF THE INVENTION

It is therefore an object of this invention to provide a method for preventing gate oxide damage caused by post poly definition implantation.

It is another object of this invention to reduce the effective antenna ratio to zero by implementing a new mask layout during ion implantation.

It is still another object of this invention to provide a method for removing the dependency of ion implantation damage to pattern sensitivity.

These objects are accomplished by providing a silicon substrate having a polysilicon gate formed over a gate oxide, covering all of the polysilicon lines with photoresist mask, and therefore reducing the effective antenna ratio to zero, and performing ion implantation to form source/drain regions as well as adjusting threshold voltage. In another embodiment, the openings in the photoresist mask are designed with certain geometrical constraints so as to make the antenna ratio small.

BRIEF DESCRIPTION OF THE DRAWINGS

The objects and features of this invention will become apparent more readily from a reading of the description in conjunction with drawings wherein similar numerals refer to similar parts throughout the several views that follow:

FIG. 1 is a schematic drawing showing an antenna structure of prior art.

DESCRIPTION OF THE PREFERRED EMBODIMENTS

Figure 2C:
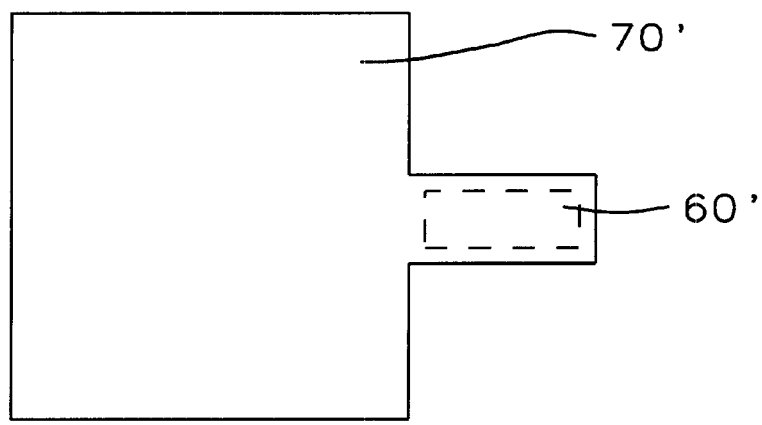
FIG. 2c is a top view of FIG. 2d, which in turn is a schematic drawing showing a structure with a large antenna ratio of this invention.

Referring now to the drawings, in particular to FIGS. 2a–2b and 2c–2d, there are shown schematic drawings of antenna structures used in a series of experiments for measuring oxide damage caused by ion implantation during post-poly gate definition in MOS devices. As is well known, ion implantation is performed to form source/drain regions in MOSFETs and also for adjusting threshold voltages. It has been found that the problem of wafer charging and the concomitant oxide damage can be attributed to four charge sources, namely, the irradiated ion beam, the secondary electrons emitted from the gate electrode, the charges accumulated on the photoresist surface around the gate electrode, and the secondary electrons emitted from a wafer holder. While it is generally known that the former three charges accelerate the oxide damage and the latter reduces it, our experiments show that with proper design, the photoresist can also help prevent oxide damage. Hence, embodiments related to the photo resist application are disclosed.

Figure 2D:
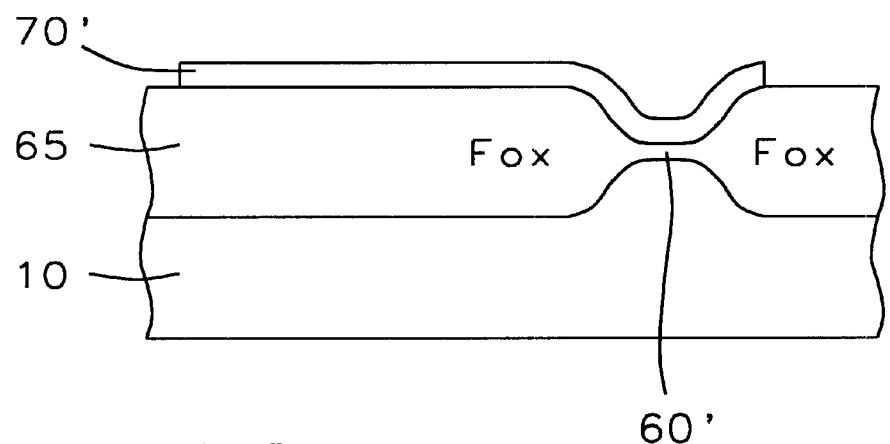
FIG. 2a is a top view of FIG. 2b, which in turn is a schematic drawing showing a structure with an antenna ratio approximating unity according to this invention.

The MOS antenna test structures of FIGS. 2b and 2d consist of a silicon substrate (10), a thin silicon dioxide as gate oxide (60) and a polysilicon gate (70). The preferred thickness of gate oxide (60) is between about 5 to 20 nanometers (nm) and that of polysilicon gate is between about 100 to 200 nm. The gate oxide thickness is so chosen that it is most sensitive to ion implantation damage. Variations on structure shown in FIG. 2d is actually used to measure breakdown voltage of the gate oxide during implantation. FIG. 2b is included here as a reference to show how an area ratio of polysilicon gate (70) to area of oxide (60) approximating unity can be obtained by depositing polysilicon covering all of the area over gate oxide as shown in the top view, FIG. 2a.

The width and length of the MOS device shown schematically in FIG. 2d and used as reference are 5.0 and 0.7 micrometers ($\mu$m), respectively, thus having an area of 3.5 $\mu m^2$. This small area device (60) in FIG. 2d is connected to a large area polysilicon antenna (70) spanning the thick field oxide (Fox) shown in the same Figure. The dimensions of the antenna and the antenna ratio, that is the ratio of the area of the antenna to the area of the reference device, used for the experiments are shown in the Table below:

| Antenna Dimensions ($\mu$m) | | | | Ratio | $V_t$ | | $V_t$ Shift | |
|---|---|---|---|---|---|---|---|---|
| Length | Width | Perim. | Area | A/3.5 | NMOS | PMOS | NMOS | PMOS |
| 21.2 | 21.2 | 84.8 | 449 | 128 | 0.762 | −0.97 | −0.033 | −.030 |
| 42.3 | 42.3 | 169.2 | 1789 | 512 | 0.747 | −0.98 | −0.048 | −.040 |
| 71.7 | 100 | 343.4 | 7170 | 2049 | 0.731 | −0.99 | −0.064 | −.050 |
| 140 | 204.8 | 689.6 | 28672 | 8192 | 0.711 | −1.03 | −0.084 | −.090 |

(It will be noted in the Table above that the antenna ratio is obtained by dividing the antenna area by the area of the MOS device having an area of 3.5 $\mu m^2$, as stated above.)

Figure 3:
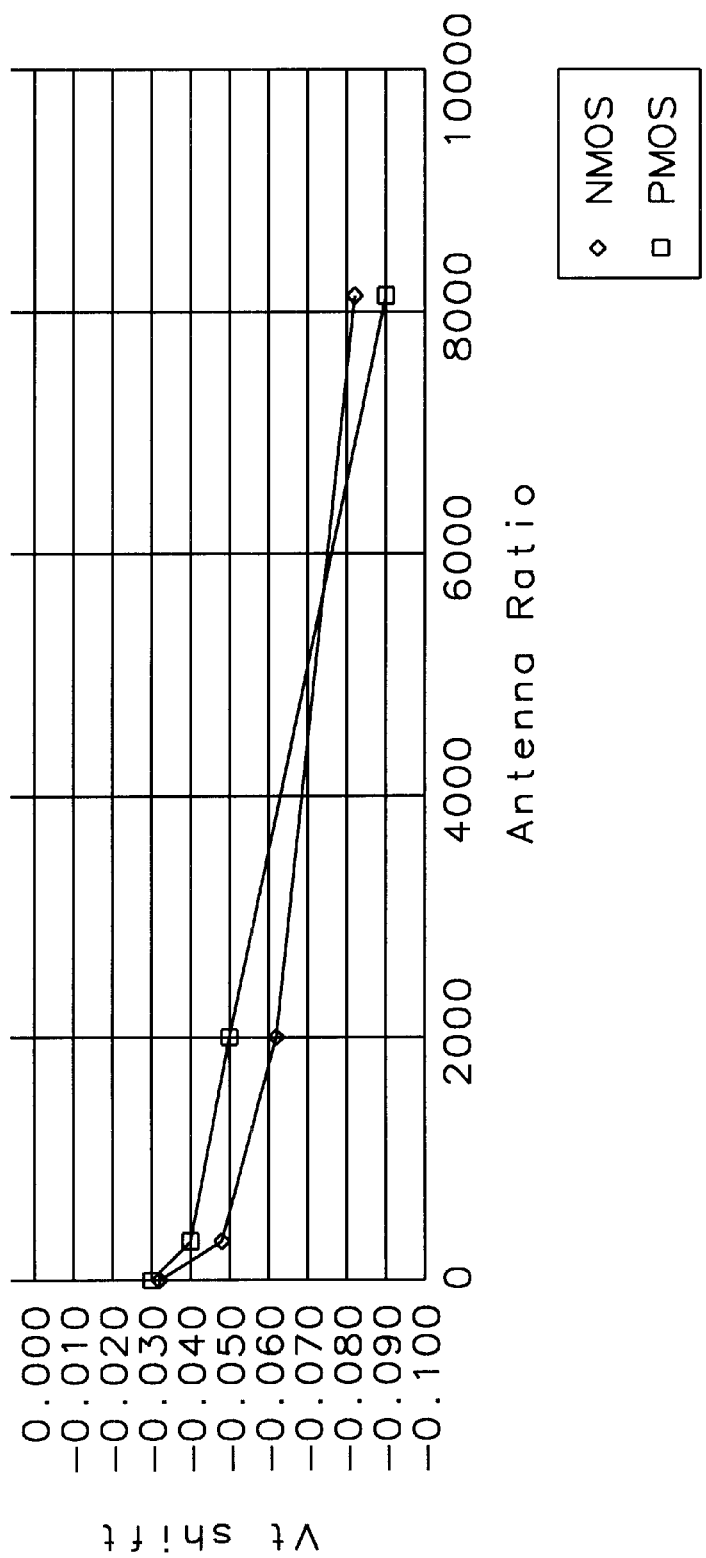
FIG. 3 is a plot of shift in threshold voltage, $V_t$, as a function of antenna ratio according to this invention.

Using different antenna ratios during the experiments, the parameters of the ion implantation were held constant for each configuration of the antenna. Thus, the current density of the ion beam was between about 0.3 to 0.9 milliamps (mA)/cm$^2$ with a dose of 3×10$^{15}$ ions/cm$^2$. The effects of the ion implantation were measured by the amount that the threshold voltage $V_t$ varied, since, as is well known in the art, $V_t$ can be separately adjusted by ion implantation. Arsenic was used for implantation in the regions under the gate oxide which, as expected and as shown in the Table above, caused a negative shift. As is well known, a positive voltage must be applied to the drain of an NMOS device to keep drain-substrate reverse-biased, while in PMOS devices this voltage must be negative. Thus, for the reference device of area 3.5 $\mu m^2$, the threshold voltages, Vt, were 0.795 volts for the NMOS type device and −0.940 volts for the PMOS type. The shift in $V_t$ as a function of antenna ratio is plotted in FIG. 3 for both NMOS and PMOS.

The ion implantation experiments included control wafers that were not covered with any photoresist. Each wafer had 100 test sites which were then tested for oxide damage after ion implantation. It was found out that a high percentage of the test sites had failed due to lack of photoresist coverage. In the second set of experiments, ion implantation was carried out in the conventional manner, that is, with a 1.34 $\mu$m photoresist layer uniformly covering the wafer. This time, it was found out that with an antenna ratio of 8192, 23 percent of the devices failed due to oxide damage during implantation. The location of the damaged sites for this case are shown with zeros (0s) in FIG. 4 where the numbers indicate the breakdown voltages measured at the respective sites.

Figure 4:
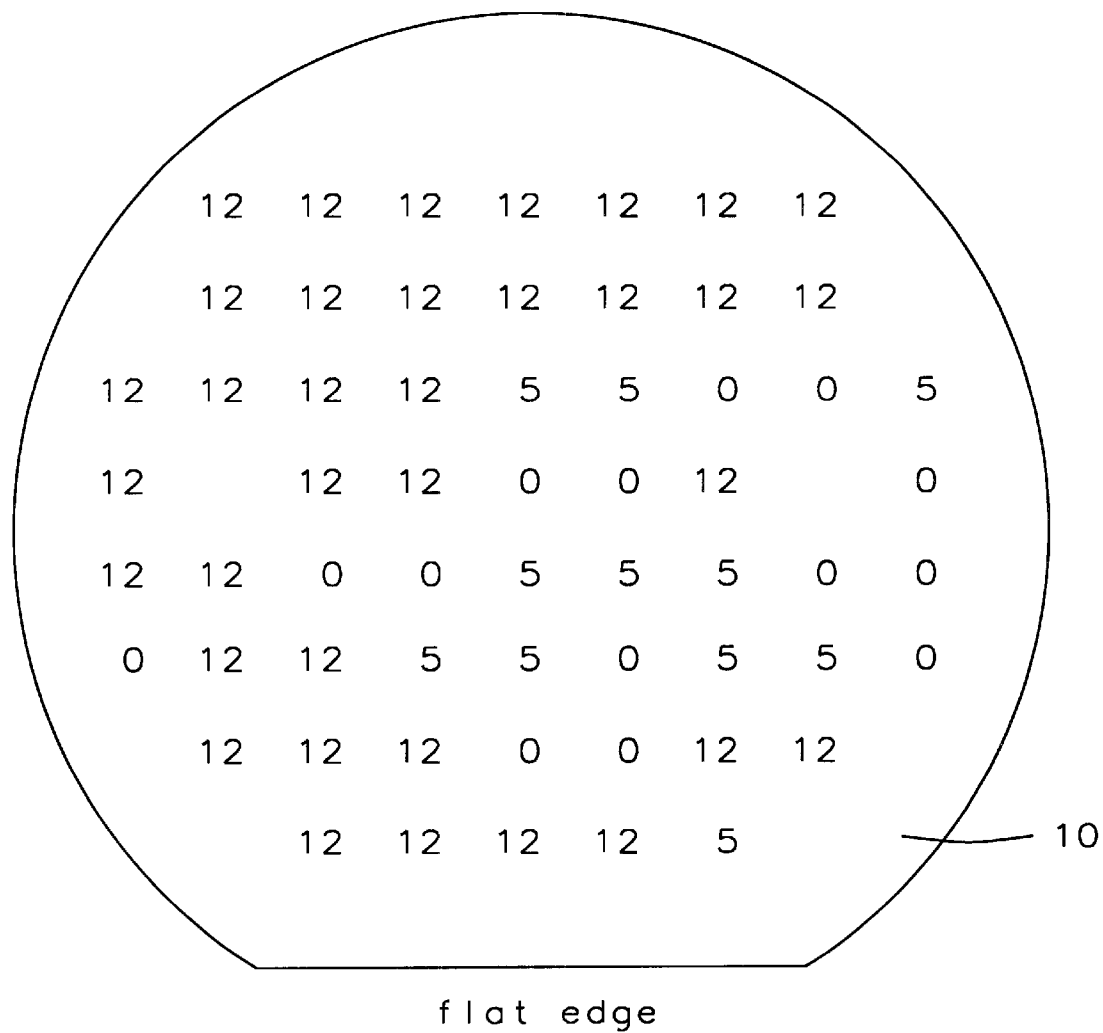
FIG. 4 is a plan view of a wafer showing measured breakdown voltages at test sites where zeros "0" indicate catastrophic oxide damage of this invention.

As seen from FIG. 4, the location of the failed oxide sites are independent of location; that is, they are found around the edge of the wafer as well as in the center. Therefore, even the expected aid from the secondary electrons that flow from the aluminum wafer holder mostly to the close by edges of the wafer to reduce oxide damage is insignificant when compared to the damage, as it is found, caused by the variations in the local layout of the photoresist in the areas surrounding the polysilicon gate.

Figure 5:
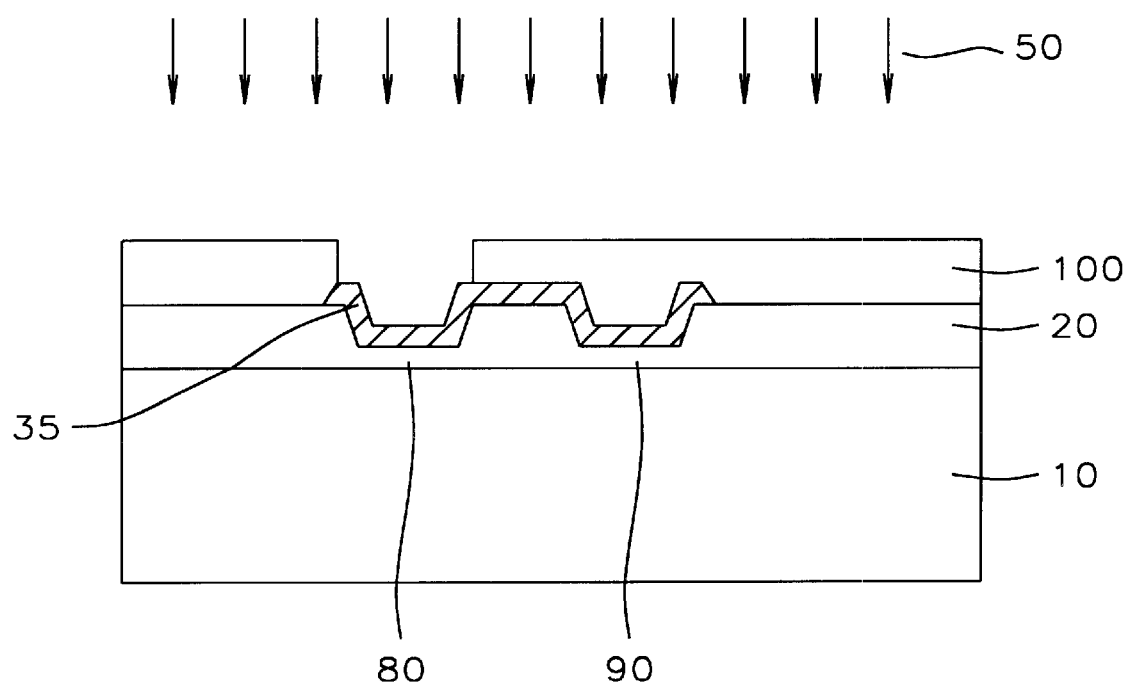
FIG. 5 is a schematic drawing showing a photoresist mask covering a gate electrode while not covering another one according to this invention.

A possible explanation of the effect of the photoresist coverage and layout is given in FIG. 5. The photoresist layer (100) of FIG. 5 locally surrounds the gate electrode of device (80), while that of device (90), the gate electrode is entirely covered by the photoresist layer. It is believed therefore, that the number of charged particles that pass unimpeded through the gate oxide in device (80) is much larger than that would pass through device (90) that is protected by the photoresist layer (100) covering the polysilicon gate. Furthermore, according to Wolf in his book "Silicon Processing for the VLSI Era," vol. 3, Lattice Press, Sunset Beach, Calif., 1990, p. 513, during implantation, polysilicon gate generates secondary electrons which are attracted to the positive potential of the photoresist surface surrounding the gate. These positive charges on the photoresist surface travel to the gate electrode which is at a lower potential. The net result of all this is to increase the gate current, which in turn stress the gate oxide to cause damage.

Figure 6A:
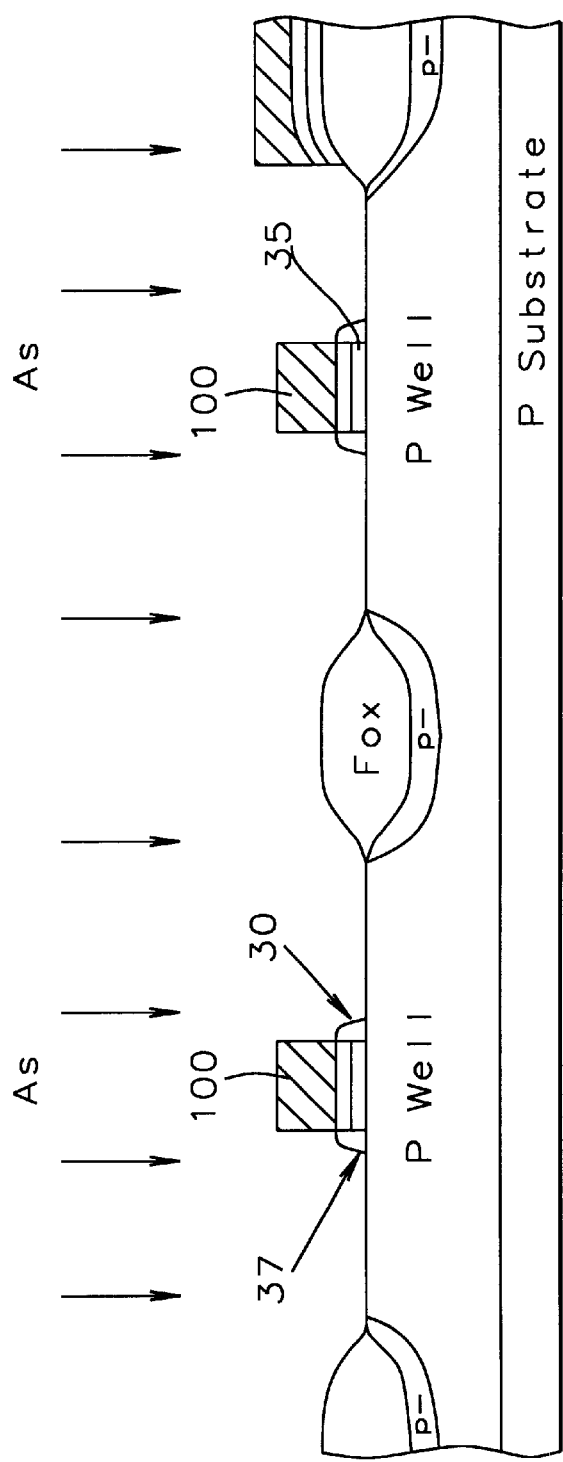
FIG. 6 is a schematic drawing showing a photoresist mask of this invention covering all poly lines during ion implantation.

It is disclosed in this invention that with a preferred photoresist mask layout, the exposure of gate oxide to damage can be prevented. For this purpose, it is preferred that the photoresist mask completely cover the polysilicon electrodes during ion implantation. This is shown in FIG. 6a where photoresist mask (100) covers polysilicon layer (35). Poly gate (35) is formed over gate oxide (30) and is surrounded by two oxide sidewall spacers (37). It will be appreciated that impeding charge build-up on the poly gate with the presence of a photoresist mask cover is equivalent to having an effective antenna ratio of zero. Consequently, the oxide damage is prevented from occurring. Furthermore, having an effective antenna ratio of zero means no dimension of polysilicon electrodes will affect oxide damage, hence the insensitivity of ion implantation to circuit patterns. The preferred thickness of photoresist (100) is between about 1 to 2 $\mu$m. It is also preferred that the thickness of gate oxide and poly gate are between about 5 to 20 nm, and 100 to 300 nm, respectively. Furthermore, the arsenic implantation shown in FIG. 6 is accomplished with a dose of about $3\times10^{15}$ ions/cm$^2$ at an energy between about 30 to 70 keV. It is preferred that the ion implantation for adjusting the threshold voltage is accomplished with boron-fluoride (BF$_2$) ions at a dose of about $3\times10^{12}$ ions/cm$^2$ and at an energy level between about 25 to 80 keV.

Figure 6B:
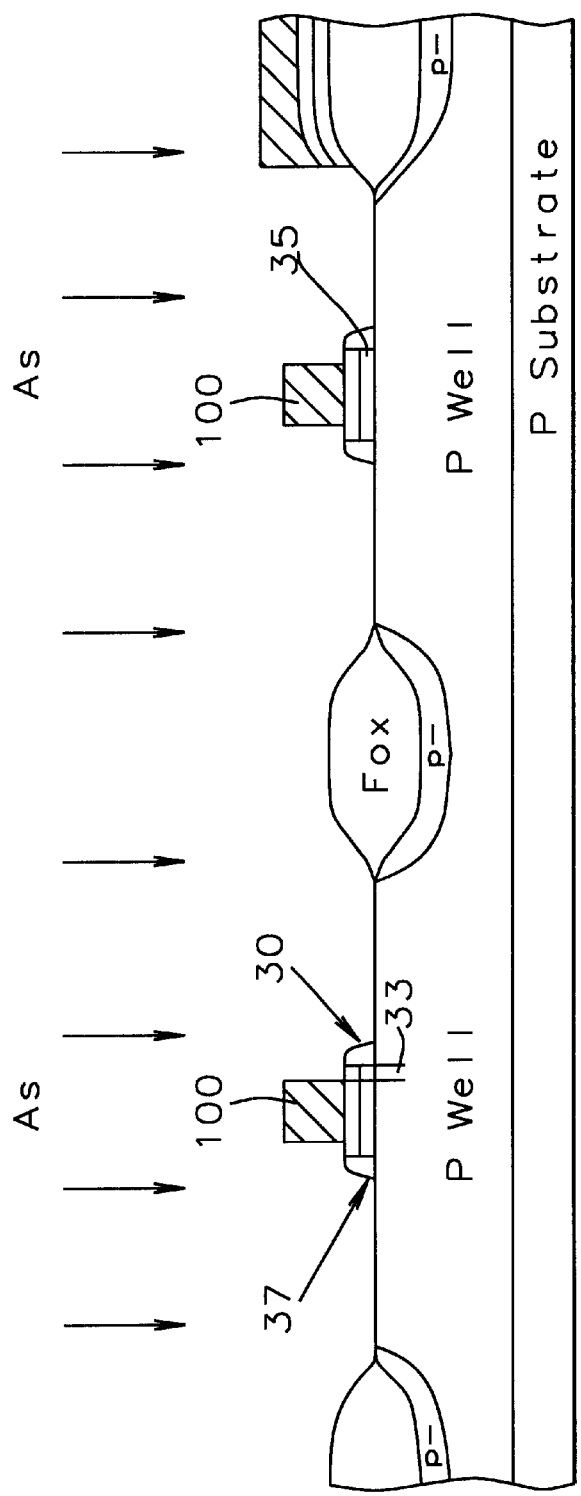

In another embodiment, the amount of oxide damage is minimized by limiting the amount of oxide that is exposed to ion beam. This is accomplished by providing a minimum distance (33) that is offset from the edge of the photoresist mask surrounding the polysilicon gate to the edge of the gate oxide as shown in FIG. 6b. It will be appreciated that this offset distance will provide manufacturing latitude in accommodating the alignment tolerances required for forming the photoresist mask (100). It is preferred that the offset distance (33) is between about 0.02 to 0.03 $\mu$m.

While the invention has been particularly shown and described with reference to the preferred embodiments thereof, it will be understood by those skilled in the art that various changes in form and details may be made without departing from the spirit and scope of the invention.

What is claimed is:

1. An integrated circuit structure comprising:
    a substrate having polysilicon electrodes over a gate oxide;
    a photoresist mask completely covering said polysilicon electrodes, wherein said photoresist provides coverage during all ion implantation steps in order to prevent oxide damage during any subsequent ion implantation; and
    a region adjacent to polysilicon electrodes where source/drain can be formed while the mask is on.

2. The structure of claim 1, wherein said gate oxide has a thickness between about 5 to 10 nm.

3. The structure of claim 1, wherein said polysilicon electrodes have a thickness between about 100 to 300 nm.

4. The structure of claim 1, wherein said photoresist mask has a thickness between about 1 to 2 $\mu$m.

5. The structure of claim 1, wherein said source/drain regions are formed in said substrate by ion implantation.

6. The structure of claim 5, wherein said ion implantation is accomplished with As ions.

7. An integrated circuit structure comprising:
    a substrate having polysilicon electrodes over a gate oxide;
    a photoresist mask having an offset to the edge of said gate oxide, thus partially covering said polysilicon electrodes; and
    a region adjacent to polysilicon electrodes where source/drain can be formed while the mask is on.

8. The structure of claim 7, wherein said gate oxide has a thickness between about 5 to 20 nm.

9. The structure of claim 7, wherein said polysilicon electrodes have a thickness between about 100 to 300 nm.

10. The structure of claim 7, wherein said partially covering photoresist mask has a thickness between about 1 to 2 $\mu$m.

11. The structure of claim 7, wherein said off-set is between about 0.02 to 0.03 $\mu$m to edge of said gate oxide.

12. The structure of claim 7, wherein said source/drain regions are formed in said substrate by ion implantation.

13. The structure of claim 12, wherein said ion implantation is accomplished with As ions.

* * * * *